United States Patent
Xue et al.

(10) Patent No.: US 8,642,385 B2
(45) Date of Patent: Feb. 4, 2014

(54) WAFER LEVEL PACKAGE STRUCTURE AND THE FABRICATION METHOD THEREOF

(75) Inventors: Yan Xun Xue, Los Gatos, CA (US); Ping Huang, Songjiang (CN); Yueh-Se Ho, Sunnyvale, CA (US); Hamza Yilmaz, Saratoga, CA (US); Jun Lu, San Jose, CA (US); Ming-Chen Lu, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 158 days.

(21) Appl. No.: 13/205,864

(22) Filed: Aug. 9, 2011

(65) Prior Publication Data

US 2013/0037935 A1 Feb. 14, 2013

(51) Int. Cl.
*H01L 23/498* (2006.01)
*H01L 21/78* (2006.01)

(52) U.S. Cl.
USPC ......................................... 438/113; 257/737

(58) Field of Classification Search
CPC .............................. H01L 23/498; H01L 21/78
USPC ............ 438/113; 257/737, E21.599, E23.068
See application file for complete search history.

(56) References Cited

U.S. PATENT DOCUMENTS 7,514,787 B2 * 4/2009 Yamada ......................... 257/737
2008/0138935 A1 * 6/2008 Pu et al. ........................ 438/113

* cited by examiner

*Primary Examiner* — Walter H Swanson
(74) *Attorney, Agent, or Firm* — Chein-Hwa Tsao; C H Emily LLC

(57) ABSTRACT

The present invention proposes a package for semiconductor device and the fabrication method for integrally encapsulating a whole semiconductor chip within a molding compound. In the semicondcutor device package, bonding pads distributed on the top of the chip are redistributed into an array of redistributed bonding pads located in an dielectric layer by utilizing the redistribution technique. The electrodes or signal terminals on the top of the semiconductor chip are connected to an electrode metal segment on the bottom of the chip by conductive materials filled in through holes formed in a silicon substrate of a semiconductor wafer. Furthermore, the top molding portion and the bottom molding portion seal the semiconductor chip completely, thus providing optimum mechanical and electrical protections.

29 Claims, 15 Drawing Sheets

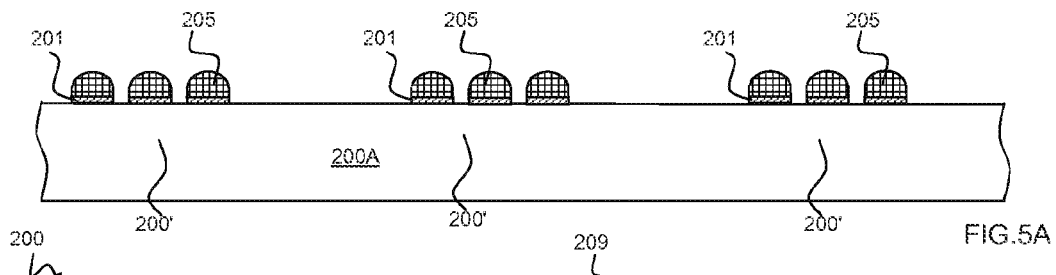
FIG.5A
FIG.5B
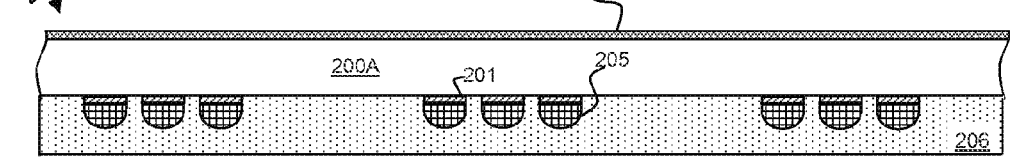
FIG.5C
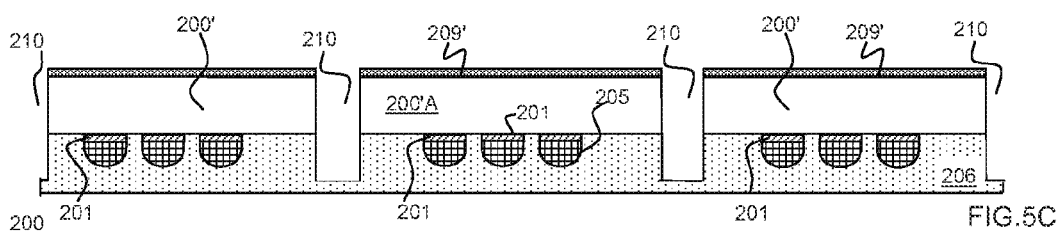
FIG.5D
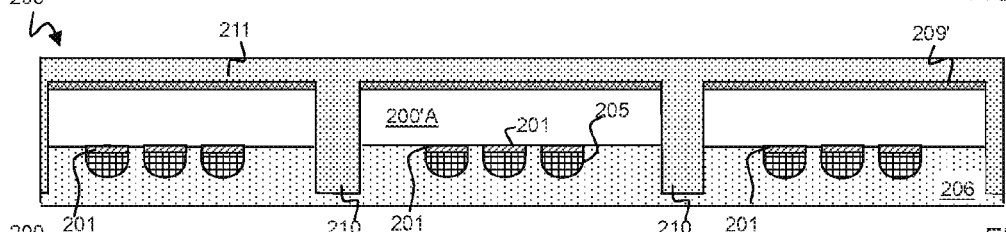
FIG.5E
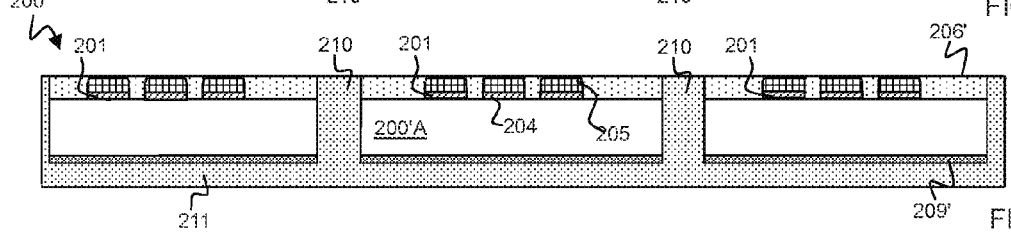
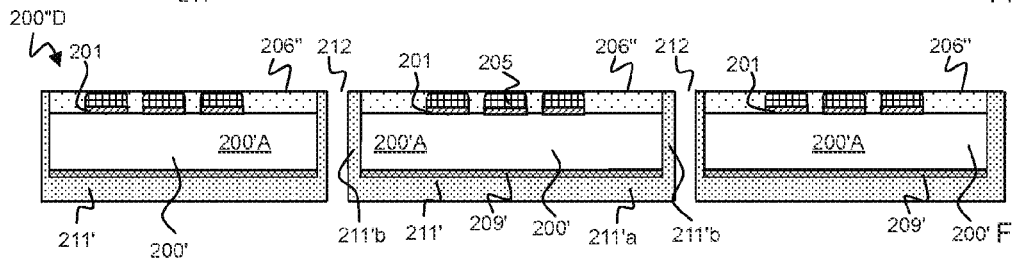
FIG.5F

US 8,642,385 B2

WAFER LEVEL PACKAGE STRUCTURE AND THE FABRICATION METHOD THEREOF

FIELD OF THE INVENTION

The present invention is directed to a package for semiconductor device and the fabrication method thereof, and more particularly to a package structure and the Wafer Level Chip Scale Packaging (WLCSP) method for thin semiconductor chips.

BACKGROUND OF THE INVENTION

In the advanced chip packaging methods, the WLCSP (Wafer Level Chip Scale Packaging) technique is a technique in which packaging and tests are performed on a semiconductor wafer and then the wafer is molded and singulated into individual IC packages. The IC package size after packaging is almost the same as the original size of the bare die. The package has good heat dissipation and electrical properties.

Usually, the thickness of the semiconductor chip is reduced to a certain value based on the requirement of substrate resistance reduction or chip size reduction. However, the thinner the chip is, the more easily it cracks. Therefore, any shape modification of the semiconductor chip should be avoided. However, the actual fabrication processes have some issues, for example, singulation of the wafer easily causes the edge or corner of a chip to crack resulting in the chip being fragile or lacking the corner. On the other hand, in most of the current wafer level chip scale packages some parts of the chip in the devices are exposed from the molding compound, which results in poor moisture resistance and lacks of mechanical protection that causes damage in its electrical properties.

U.S. Patent Application Publication No. 2009/0032871 discloses a WLCSP method of forming a semiconductor device including some electrodes on the front side of the semiconductor chip connected with those on the backside of the chip by a conductive structure positioned to an edge of the chip, with the electrodes on the backside of the chip exposed out of the molding compound after the chip is molded and separated from the wafer.

U.S. Pat. No. 6,107,164 also discloses a WLCSP method of manufacturing a semiconductor device. In this method, the protruded electrodes are formed on a plurality of chip areas on a front side of a wafer. Grooves are defined in boundary regions of the plurality of the chip areas. The surface of the wafer with the grooves is covered with a molding compound. Thus, the wafer is thinned on its backside to expose the grooves. The individual chips are separated from the wafer by cutting at the exposed groove portions with the backside of the resulted chip exposed out from the molding compound.

Furthermore, U.S. Pat. Nos. 6,420,244 and 6,852,607 also disclose similar WLCSP methods.

However, the conventional WLCSP methods have not disclose a method for completely seal the chip for protection while reducing the thickness of the wafer and to maintain a certain thickness of the thinned wafer to provide mechanical support sufficient for subsequent working procedures.

BRIEF DESCRIPTION OF THE DRAWINGS

The embodiments of the present invention will not be more thoroughly described herein with reference to the accompanying drawings, which, however, are only for descriptive and illustrative purposes and do not constitute a restriction on the scope of the present invention.

FIGS. 5A-5F are cross-sectional schematic views showing a fabrication processes without redistribution of the bonding pads and the formation of the through holes according to an alternative embodiment of the present invention.

DETAILED DESCRIPTION OF THE EMBODIMENTS

Figure 1A:
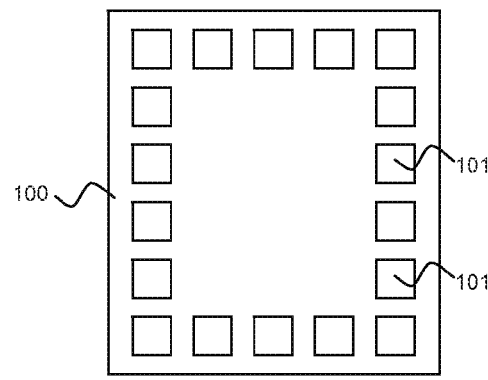
FIGS. 1A-1B are top and cross-sectional schematic views illustrating the bonding pads formed on the top surface and around the edges of a semiconductor chip.
Figure 1B:
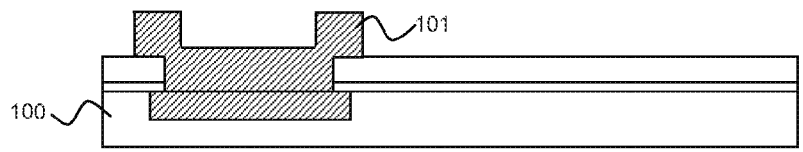

Referring to FIG. 1A, which shows a top view of a semiconductor chip 100, a plurality of bonding pads 101 connected with the circuits in the chip 100 are formed around the edges at the top side of the chip 100. Usually, the bonding pads 101 are aluminum pads used for electrically connecting to the outside devices. For example, bonding wire is directly formed on the bonding pads or solder bump is formed on the under-bump metallurgy (UBM) layers, such as Ti, Cu or Ni layer, which are deposited on the bonding pads for connecting to the peripheral devices. The bonding pads can be the I/O pad or Power or Ground interface of the circuit in the semiconductor chip 100. FIG. 1B is a cross sectional view that illustrates the bonding pads 101 formed on the edge at the top surface of the semiconductor chip 100.

Figure 1C:
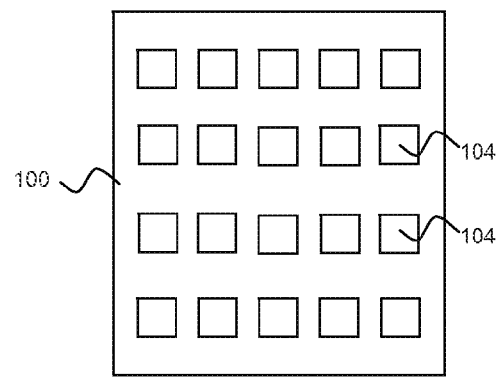
FIG. 1C is top and cross-sectional schematic views illustrating the arrays of bonding pads formed on the top surface of the semiconductor chip by redistribution the bonding pads.
Figure 1D:
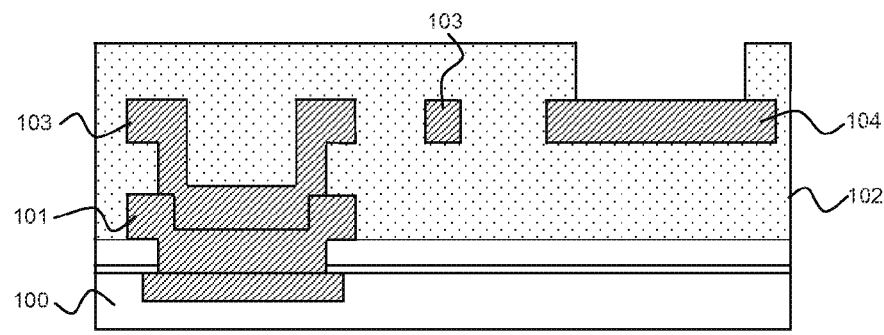
FIG. 1D is a cross-sectional schematic view illustrating the redistribution of the bonding pads.

Referring to FIG. 1C, by utilizing RDL (Redistribution Layer) technique, the bonding pads formed around the edges at the top surface of the semiconductor chip 100 can be redistributed into an array or a matrix of the redistributed bonding pads 104 located on the top surface of the semiconductor chip 100. As shown in FIG. 1D, the bonding pads 101 are located inside a dielectric layer 102 covering the top surface of the semiconductor chip 100. The dielectric layer 102 can be made from polyimide. The redistributed bonding pads 104 are either electrically connected with the bonding pads 101 by traces 103 formed inside the dielectric layer 102, or are not electrically connected to bonding pad 101 depending on its use. The traces 103 is usually not straight, therefore, the cross-section in FIG. 1D does not show the physically connection between the traces 103 and the redistributed bonding pads 104 and between the traces 103 and bonding pads 101.

Figure 1E:
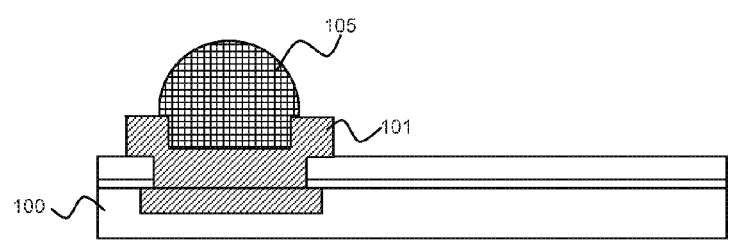
FIGS. 1E and 1F are cross-sectional schematic views illustrating the placement of solder bumps on the original bonding pads and redistributed bonding pads of FIGS. 1B and 1D respectively.
Figure 1F:
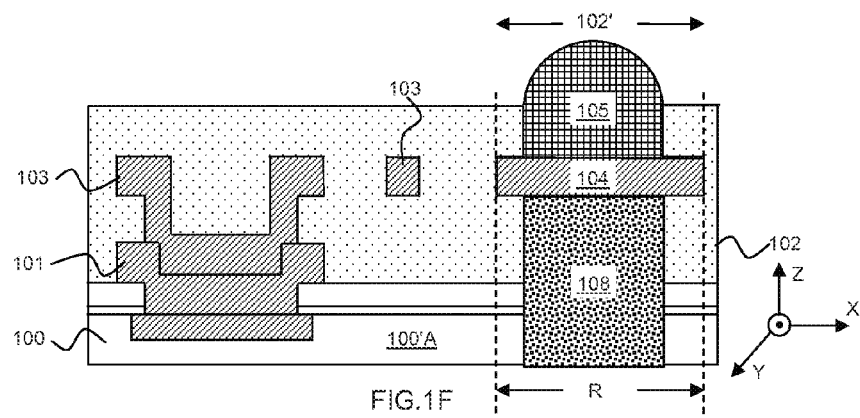

Referring to FIGS. 1B and 1E, a solder bump 105 is directly formed on the bonding pads 101 at the top surface of the semiconductor chip 100, while in FIGS. 1D and 1F, the solder bump 105 is formed on the redistributed bonding pads 104, some of which are connected to the backside of the chip 100 through the conductive material 108.

Figure 2A:
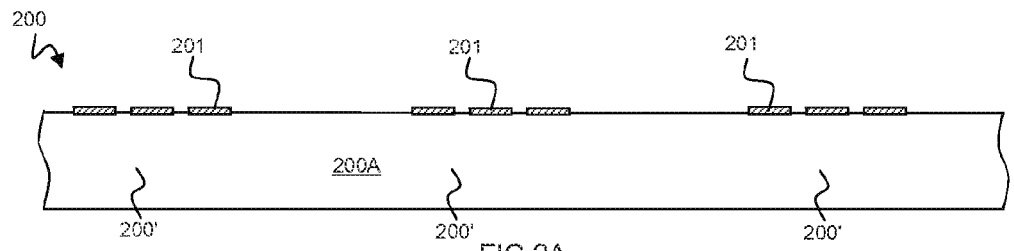
FIGS. 2A-2M are cross-sectional schematic views showing a fabrication processes with the redistributed bonding pads connected to the electrodes on the backside of the chip by conductive materials filled in the through holes according to an embodiment of the present invention.
Figure 2B:
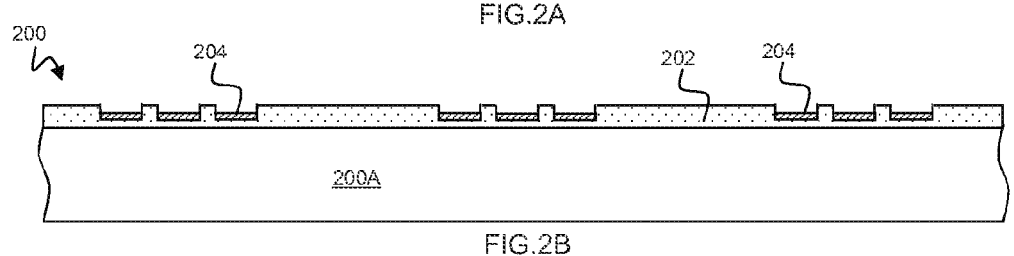
Figure 2C:
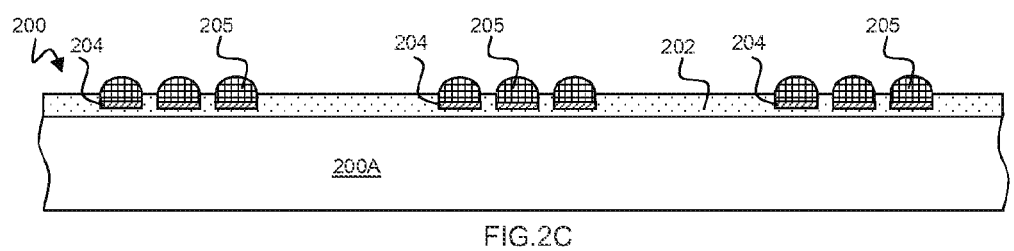
Figure 2D:
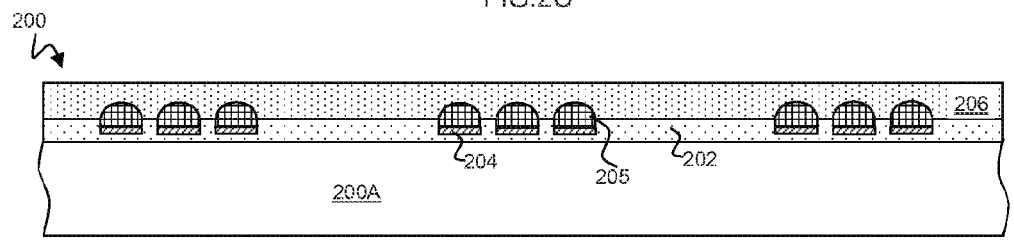
Figure 2E:
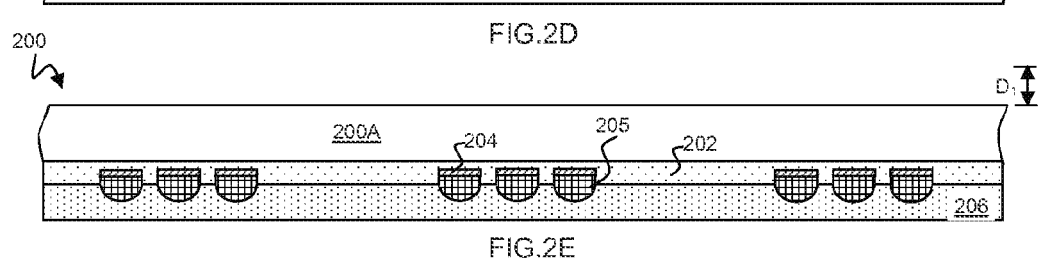
Figure 2F:
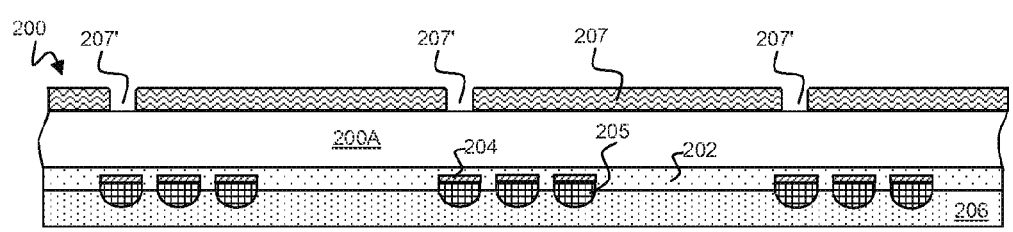
Figure 2G:
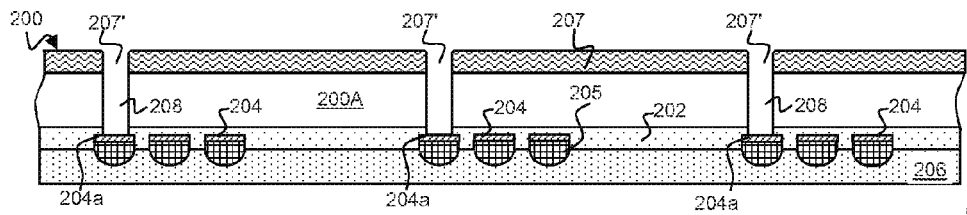

FIGS. 2A-2M are cross-sectional views illustrating a WLP method according to an embodiment of the present invention. As shown in FIG. 2A, a plurality of semiconductor chips 200' are formed in a silicon substrate 200A of a wafer 200 with a scribe line (not shown) formed between two adjacent chips on the front side of the wafer. Bonding pads 201 of the chip 200' are located on the front side of the wafer. By utilizing the RDL technique, the bonding pads 201 are redistributed into an array of redistributed bonding pads 204 located in a dielectric layer 202 covering the wafer 200 and the chip 200', as shown in FIG. 2B. Solder bumps 205 are then formed on the redistributed bonding pads 204, as shown in FIG. 2C. Alternatively, the solder bump 205 is directly placed on the bonding pads 201. A first molding layer 206 is deposited on the front side of the wafer 200 to encapsulate the solder bump 205 and cover the dielectric layer 202, as shown in FIG. 2D. Then, the backside of the wafer 200 is ground to reduce the thickness of the wafer 200, for example, chemical mechanical polishing (CMP) is performed, as shown in FIG. 2E, to reduce the thickness of the wafer 200 (i.e. $D_1$). Then, a resist layer 207 patterned with opening 207' is applied to the backside of the thinned wafer 200, as shown in FIG. 2F. The resist layer 207 can be a photoresist layer, SiN layer or $SiO_2$ layer. Each opening 207' in the resist layer 207 is correctly aligned to one first type bonding pad 204 (such as the first type bonding pads 204a shown in FIG. 2G) in the vertical direction, thus the substrate 200A and dielectric layer 202 are etched from the backside of the thinned wafer 200 through the opening 207' by utilizing the TSV (Through Silicon Via) technique with the resist layer 207 serving as the hard mask, with an etching end point stopping on the first type bonding pads 204a, forming through holes 208. The first type bonding pads 204a are not connected with any bonding pad 201 of the chip 200'. The first type bonding pads 204a are used for connecting to some electrodes or signal terminals formed on the backside of the chip 200', which is described later. After through holes 208 are completely formed, the resist layer 207 is removed. A plurality of etching methods for forming through holes 208 are available, such as dry, wet or laser etching. A thin layer of dielectric layer 208", for example oxide film, is deposited on the internal wall of the through holes 208 for electrical insulation the conductive materials filled in the through holes 208 from the silicon substrate area surrounding the through holes 208, i.e. the substrate 200A. To form a perfect alignment between first type bonding pads 204a and the through holes 208, the width of the opening 207's should be smaller than the width of the first type bonding pads 204 as shown in FIG. 2G.

Figure 2H:
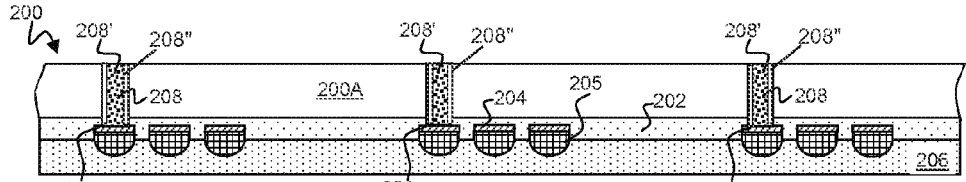
Figure 2I:
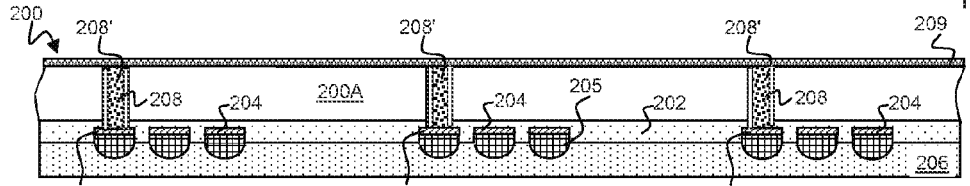
Figure 2J:
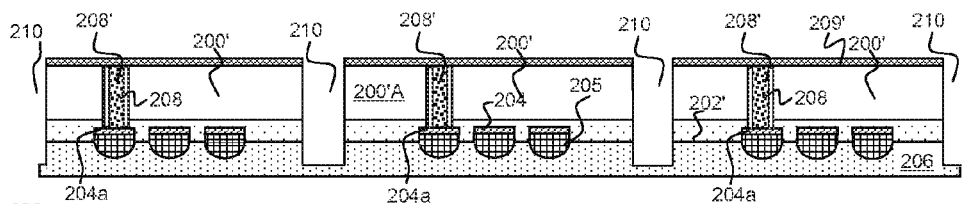
Figure 2K:
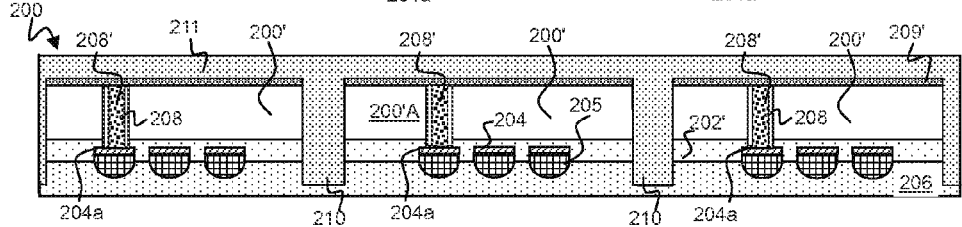

Referring to FIGS. 2H-2I, conductive material 208' is filled into the through holes 208, and the backside of the thinned wafer 200 is covered with a thin metal layer 209 in electrical contact with the conductive materials 208' filled in the through holes 208. Then the wafer 200 is sawed from the backside of the thinned wafer 200 to form cutting grooves 210 separating adjacent chips 200' with the bottom of the cutting groove 210 positioning inside the first molding layer 206. Thus, the metal layer 209 is cut into a plurality of electrode metal segments 209', each of which covers the bottom of each semiconductor chip 200'. The dielectric layer 202 is also cut into a plurality of dielectric portions 202' each of which covers the top of each chip 200', as shown in FIG. 2J. A second molding layer 211 is deposited to fill the cutting grooves 210 and encapsulate the electrode metal segment 209' located on the bottom of each chip 200', as shown in FIG. 2K.

Figure 2L:
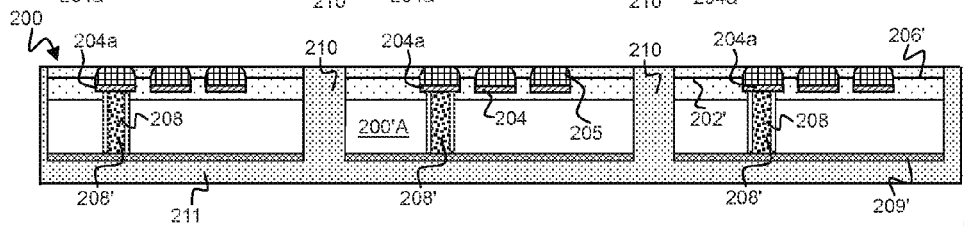
Figure 2M:
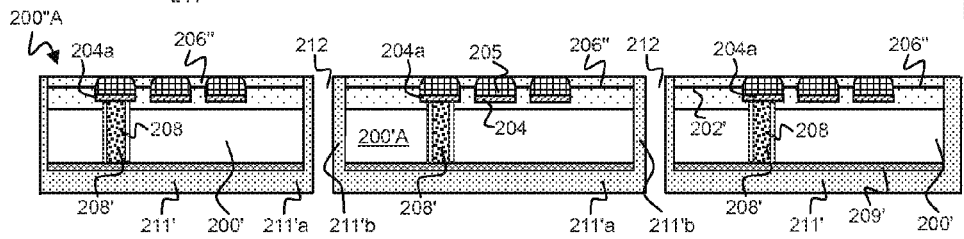

Referring to FIGS. 2L-2M, the first molding layer 206 is ground to reduce its thickness (i.e. $D_2$) such that the solder bumps 205 is exposed from the thinned first molding layer 206' as shown in FIG. 2L. Thus, the wafer is cut along the cutting grooves 210 (the cutting mark 212 is shown in FIG. 2M) with the width of the cutting mark 212 is smaller than the width of the groove 210 to separate a plurality of wafer level chip scale packages 200"A, each of which includes a semiconductor chip 200', from the wafer 200 by removing partial molding compound of the second molding layer 211 filled in the groove 210. As a result, the thinned first molding layer 206' forms a top molding portion 206" covering the dielectric portions 202' and the second molding layer 211 forms a bottom molding portion 211' that includes a first extension 211'a covering the electrode metal segment 209' and a second extension 211'b perpendicular to the first extension 211'a covering the sidewalls of the semiconductor chip 200', dielectric portion 202' and top molding portion 206", as shown in FIG. 2M.

In this process, as shown in FIG. 2M, the conductive materials 208' filled in the through holes 208 of the wafer level chip scale package 200"A is in contact with the first type bonding pads 204a and is electrically connected to the electrode metal segment 209'. As such, the semiconductor chip 200' maybe a vertical MOSFET, i.e., its main current flows from the top to the bottom of the device and vice versa. For a bottom-drain vertical MOSFET, the drain region of the semiconductor chip 200' is formed at the bottom of the chip 200'. To enhance the ohmic contact between the electrode metal segment 209' and the drain region of the chip 200', the backside of the thinned wafer 200 can be heavily doped and implanted with ions before the metal layer 209 is deposited on the backside of the thinned wafer 200. As the electrode metal segment 209' is in contact with the drain region in the silicon substrate 200'A at the bottom of the chip 200', the first type bonding pads 204a are electrically connected to the drain electrode 209' through the conductive material 208' filled in the through holes 208, and the redistributed bonding pads 204 are connected to the gate and source regions of the MOSFET located at the top of the chip 200'. For a bottom-source vertical MOSFET, i.e., the source electrode is located at the bottom and the drain electrode is located at the top of the chip 200', the first type bonding pads 204a is electrically connected to the source region on the bottom of the MOSFET through the conductive material 208' filled in the through holes 208. The advantage of using the RDL technique is that the first type bonding pads 204a and the through holes 208 are formed in the dielectric layer 202 at the non-active area of the silicon substrate 200A, thus the semiconductor chip 200' are not damaged while the silicon substrate 200A is being etched to form the through holes 208. For example, as shown on FIG. 1F, the re-distributed bonding pads 104, which are in contact with the through holes 108, are formed in the dielectric layer 102 at the non-active area (e.g. area R) in a substrate 100'A of a wafer having semiconductor chips 100 formed in the active area. In this figure, the redistributed bonding pads 104 are formed in the partial area 102' of the dielectric layer 102. The active device is not formed within Area R in three dimensions (i.e., X-Y-Z axes), which is only used for forming the through holes 108 and the re-distributed bonding pads 104.

Figure 3A:
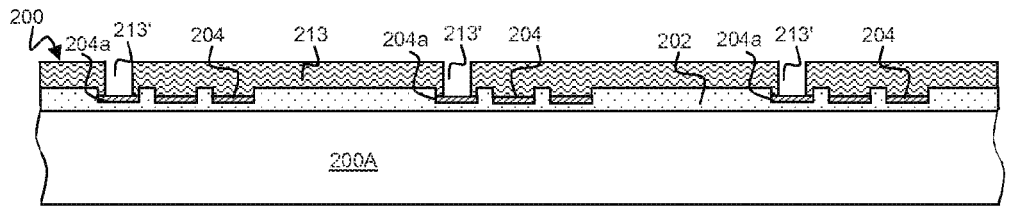
FIGS. 3A-3J are cross-sectional schematic views showing a fabrication processes with the redistributed bonding pads connected to the electrodes on the backside of the chip by solder materials filled in the through holes in according to another embodiment of the present invention.
Figure 3B:
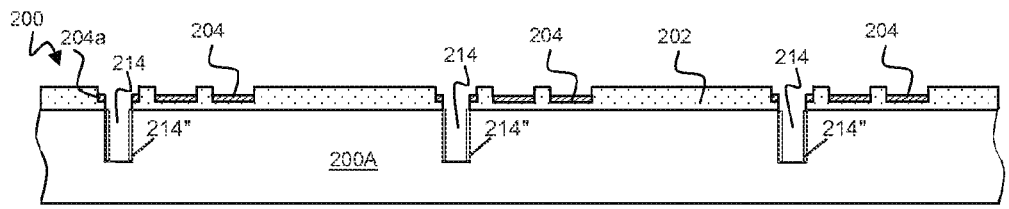

(FIGS. 3A-3J are cross-sectional views illustrating alternative WLP method similar to the WLP method described in FIGS. 2A-2M with some modification. As shown in FIG. 3A, a resist layer 213 is applied on the front side of the wafer 200 of FIG. 2B, in which redistributed bonding pads 204 are formed inside the dielectric layer 202, to cover the dielectric layer 202 and redistributed bonding pads 204. Openings 213' are formed in the resist layer 213 and are vertically aligned with the first type bonding pads 204a. The opening 213' can be formed by photo etching. The first type bonding pads 204a, the dielectric layer 202 and the silicon substrate 200A are etched through the opening 213' to a predetermined depth forming through holes 214 as shown in FIG. 3B. Since the width of the opening 213' is smaller than that of the bonding pads 204a, a portion of the bonding pads 204a is still remained after the etching. The resist layer 213 is then removed. Usually, after the through holes 214 are formed an isolation liner layer of oxide film 214'' is deposited on the internal wall of the through holes 214 for electrical isolation the silicon substrate from the conductive material filled into the through holes 214 in the subsequent step.

Figure 3C:
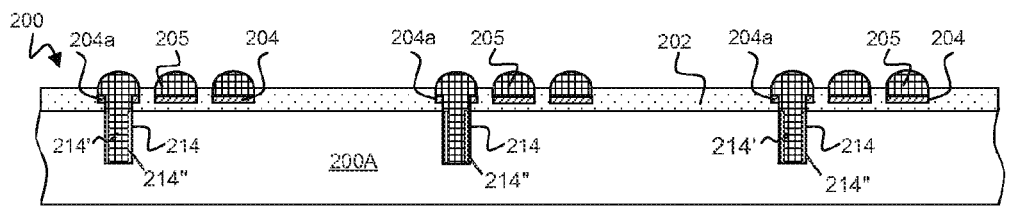
Figure 3D:
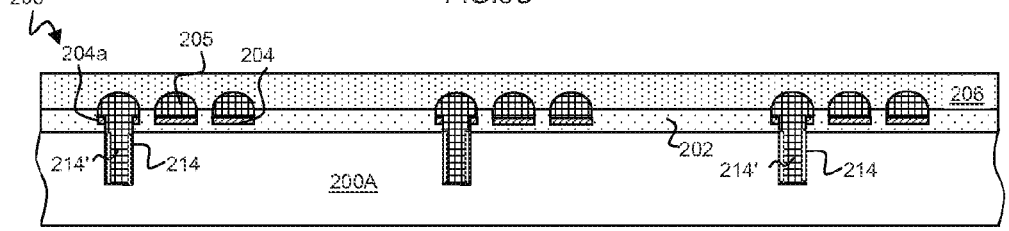
Figure 3E:
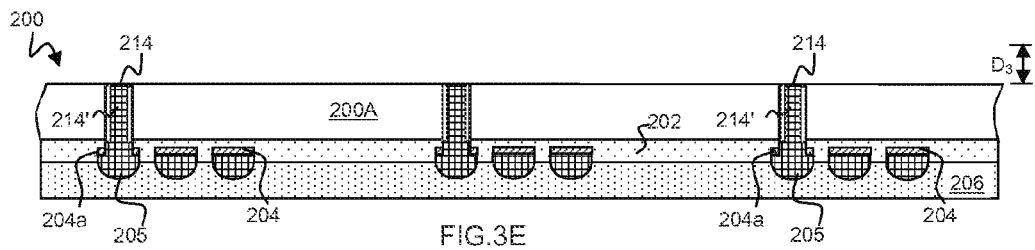
Figure 3F:
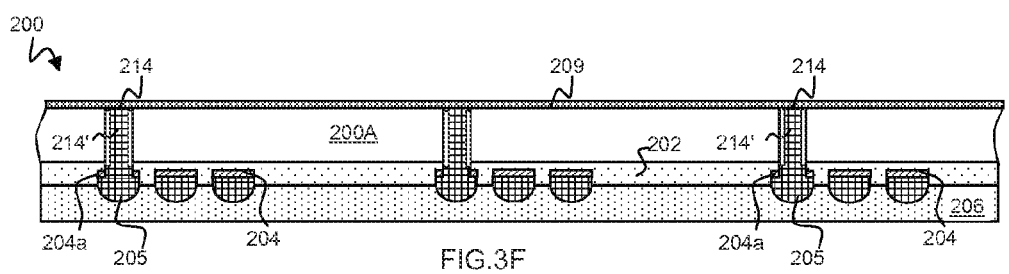
Figure 3G:
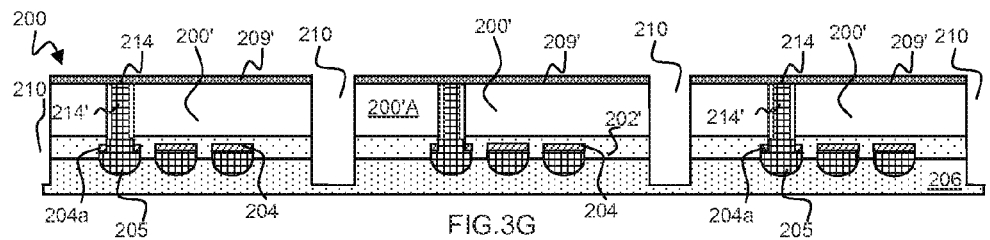
Figure 3H:
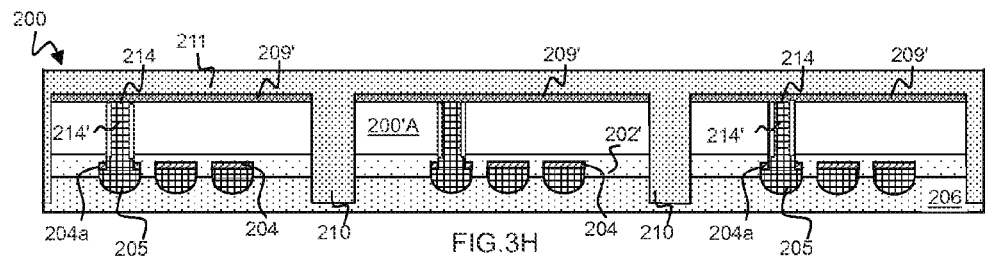
Figure 3I:
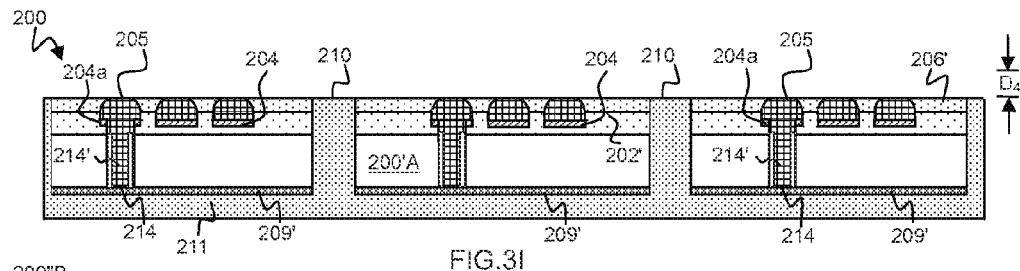
Figure 3J:
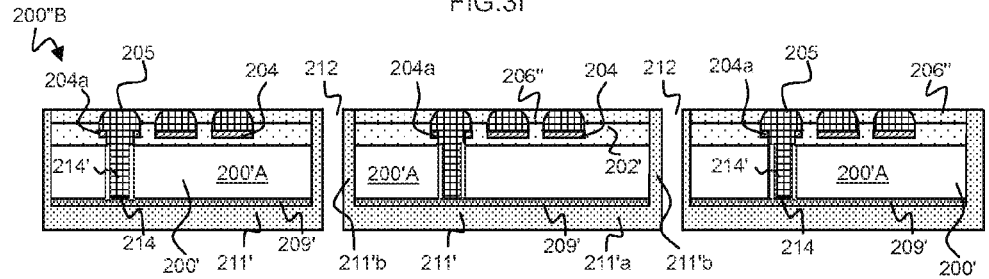

Referring to FIG. 3C, solder material 214' fills the through holes 214 and form the solder bumps 205 on the redistributed bonding pads 204 and 204a. A first molding layer 206 is then deposited on the front side of the wafer 200, which encapsulates the solder bump 205 and covers the dielectric layer 202, as shown in FIG. 3D. The wafer 200 is ground from its backside, for example a CMP process can be applied, to reduce its thickness (i.e. $D_3$) so that the solder material 214' filled in the through holes 214 is exposed out from the backside of the thinned wafer 200, as shown in FIG. 3E. A metal layer 209 is then deposited, for example by chemical vapor deposition, to cover the backside of the thinned wafer 200, which is electrically contacted to the solder material 214' filled in the through holes 214, referring to FIG. 3F. Then, the thinned wafer 200 is cut on its backside covered with the metal layer 209 to form a cutting groove 210 between two adjacent chips 200' with the bottom of the cutting groove 210 ending inside the first molding layer 206, as shown in FIG. 3G. As such, the metal layer 209 is cut into a plurality of electrode metal segments 209', each of which is located on the bottom of each chip 200', and the dielectric layer 202 is also cut into a plurality of top dielectric portions 202', each of which is located on the top of each chip 200'. Then, a second molding layer 211 is deposited to fill the cutting grooves 210 and to encapsulate the metal layer 209. As shown in FIG. 3I, the first molding layer 206 is ground to reduce a predetermined thickness (i.e. $D_4$) to expose the solder bump 205 out of the thinned first molding layer 206'. Referring to FIG. 3J, the wafer is then cut along the groove 210 to separate wafer level chip scale packages 200''B, each of which includes a chip 200', from the wafer. As described above, the chip 200' can be a vertical MOSFET. In the wafer level chip scale package 200''B, the first type bonding pads 204a is etched through its depth to form through holes 214, then the solder material 214' and the solder bump 205 are simultaneously deposited with the solder material 214' filled in the through holes 214 being a part of the bonding pads 204a on which the solder bump 205 is formed. In the same way, if the bonding pads on the top of the original chip have a reasonable arrangement then the step of redistributing the bonding pads can be omitted.

Figure 4A:
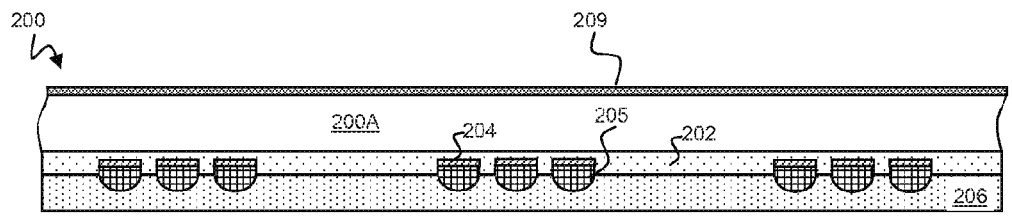
FIGS. 4A-4E are cross-sectional schematic views showing a fabrication processes without forming the through holes according to an alternative embodiment of the present invention.
Figure 4B:
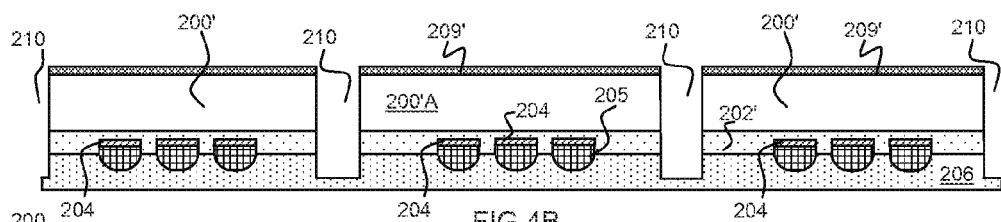
Figure 4C:
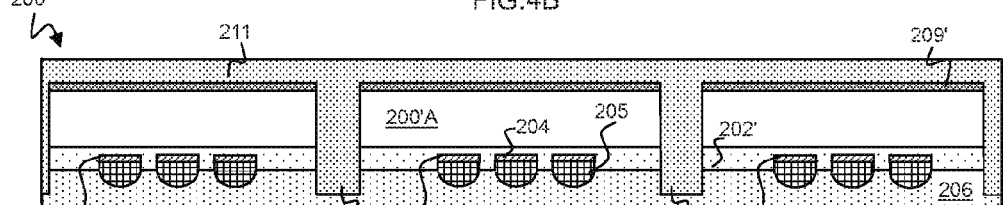
Figure 4D:
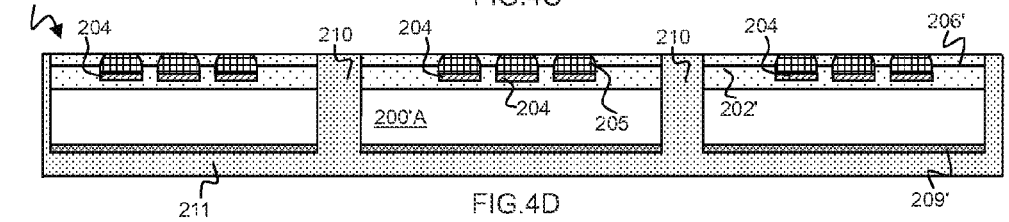
Figure 4E:
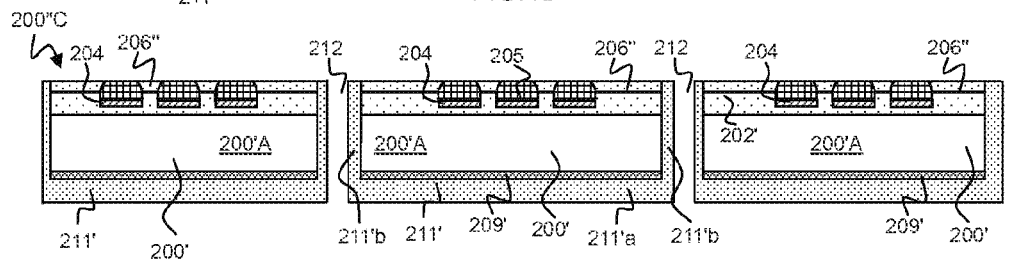

FIGS. 4A-4E are cross-sectional views illustrating another WLP method with FIG. 4A similar to FIG. 2E. As shown in FIG. 4A, a first molding layer 206 covers solder bump 205 and the dielectric layer 202 at the front side of the wafer 200. The wafer 200 is ground from its backside to reduce its thickness by a CMP process and the backside of the thinned wafer 200 is then covered with a metal layer 209. The thinned wafer 200 is cut from its backside to form cutting grooves 210, each of which locates between two adjacent chips 200', with the bottom of the grooves ending inside the first molding layer 206. The metal layer 209, therefore, is cut into the plurality of electrode metal segments 209', each of which covers the bottom of each chip 200'. The dielectric layer 202 is also cut into the plurality of dielectric portions 202', each of which covers the top of each chip 200', as shown in FIG. 4B. A second molding layer 211 is then deposited to cover the electrode metal segment 209' and also fill in the groove 210, as shown in FIG. 4C. Then, the first molding layer 206 is ground to obtain the thinned first molding layer 206' such that the solder bump 205 is exposed out from the thinned first molding layer 206', as shown in FIG. 4D. The wafer 200 is cut along the groove 210 to separate the wafer level chip scale package 200''C including top molding portion 206'' that covers the dielectric portion 202' as shown in FIG. 4E. This process does not include the steps of forming the through holes, thus there is not the connection between the redistributed bonding pads 204 at the top of the chip 200'and the electrode metal segment at the bottom of the chip. As such, the chip 200' can be a dual common drain vertical MOSFET, in which, the metal segment 209' is the common drain electrode of two MOSFETs and redistributed bonding pads 204 are respectively connected to the source and gate electrodes of the MOSFETs. Alternatively, the semiconductor chip 200' may include a plurality of diodes, such as a plurality of MOSFETs, integrated in the silicon substrate 200A, one electrode terminal of each diode is electrically connected to the electrode metal segment 209' at the backside of the chip 200' and redistributed bonding pads 204 form other electrodes of each diode on front side of the chip 200'. In the wafer level chip scale package 200''C, the bonding pads 201 formed on the top of the chip 200' are redistributed into the redistributed bonding pads 204, utilizing the RDL technique, located in the dielectric portions 202' formed by cutting the dielectric layer 202 covering the chip. The thinned molding layer 206' forms the top molding portion 206'' covering the dielectric portion 202', and the second molding layer 211 forms the bottom molding portion 211' covering the metal segment 209'. The extension 211'a of the bottom molding portion 211' covers the electrode metal segment 209' and the extension 211'b, perpendicular to the extension 211'a, covers the sidewalls of the chip 200', top dielectric portion 202' and top molding portion 206''. The solder bump 205 is exposed out of the top molding portion 206''.

The solder balls can be directly placed on bonding pads 101 on the top of the chip 100 as shown in FIG. 1E. FIGS. 5A-5F are cross-sectional views illustrating an alternative process of the process shown in FIGS. 4A-4E, excepting that the bonding pads 201 are not redistributed by RDL technique and the deposition of dielectric layer 202 is omitted.

In FIG. 5A, the solder bump 205 is directly formed on the bonding pads 201 of the wafer 200 and is protruded on the front side of the wafer 200 (i.e. the top of the chip 200'). A first molding layer 206 covers the front side of the wafer 200 and solder bump 205. The backside of the wafer 200 is ground, for example with the CMP process, to reduce its thickness. The backside of the thinned wafer 200 is then covered with a metal layer 209, as shown in FIG. 5B. The thinned wafer 200 is cut from its backside to form the cutting grooves 210, each which is formed between two adjacent chips 200', with the bottom of cutting grooves 210 endings inside the first molding layer 206. The metal layer 209 is thus cut into the plurality of electrode metal segments 209', each of which is located on the bottom of each chip 200'. A second molding layer 211 is deposited to cover the electrode metal segments 209 and fill into the grooves 210, as shown in FIG. 5D. The first molding layer 206 is ground to expose the solder bump 205 from the thinned first molding layer 206', as shown in FIG. 5E. The wafer is then cut along the grooves 210 to separate the chip 200' from the wafer, thus obtaining wafer level chip scale packages 200"D as shown in FIG. 5F. The wafer level chip scale package 200"D includes the solder bumps 205 formed on the top of the chip 200' and electrically connected to the bonding pads 201 of the chip 200', the top molding portion 206" covering the top of the chip 200' and the bottom molding portion 211' that includes an extension 211'a covering the electrode metal segment 209' and an extension 211'b, perpendicular to the extension 211'a, covering the side walls of the chip 200' and top molding portion 206" with the solder bump 205 exposed out from the top molding portion 206".

FIGS. 6A-6E are cross-sectional views illustrating another WLP method, in which a metal layer is not deposited on the backside of the thinned wafer 200.

Figure 6A:
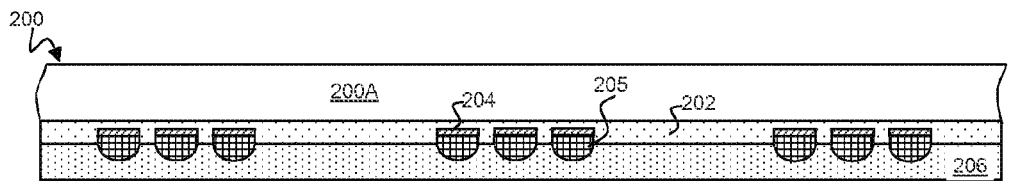
FIGS. 6A-6E are cross-sectional schematic views showing a fabrication processes without forming the through holes and the electrodes on the backside of the semiconductor chip according to an alternative embodiment of the present invention.
Figure 6B:
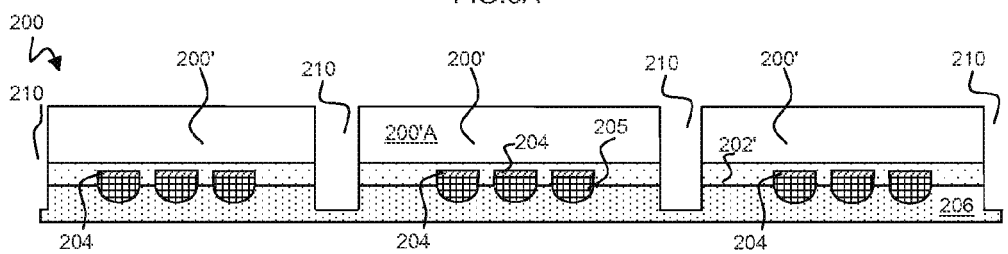
Figure 6C:
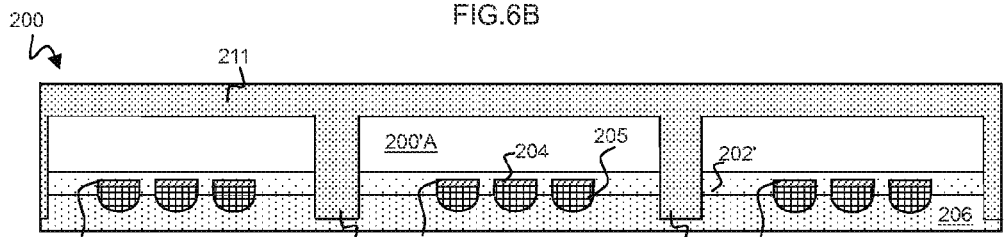
Figure 6D:
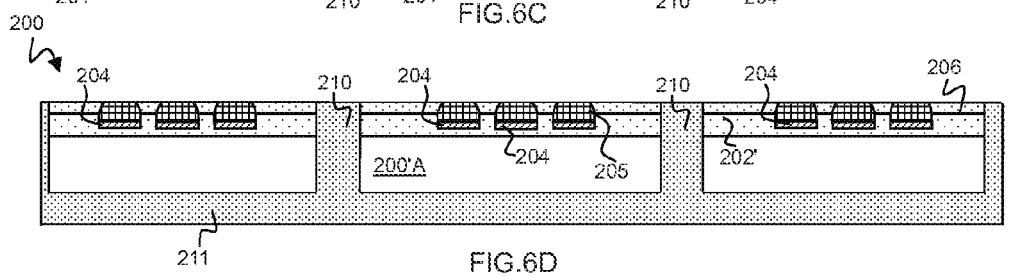
Figure 6E:
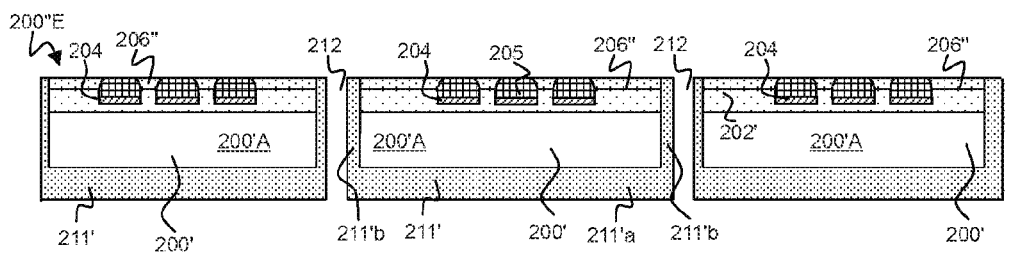

Referring to FIG. 6A, which is similar to FIG. 2E, a first molding layer 206 is deposited to cover solder bump 205 and the dielectric layer 202 at the front side of the wafer 200. The backside of the wafer 200 is ground, for example using the CMP process. The wafer 200 is then cut from its backside to form the cutting grooves 210, each of which locates between two adjacent chips 200' with the bottom of the groove locating inside the first molding layer 206. The dielectric layer 202 is also cut into the plurality of top dielectric portions 202', each of which is located on the top of each chip 200', as shown in FIG. 6B. A second molding layer 211 is then deposited to cover the backside of the thinned wafer 200 and to fill the cutting grooves 210, as shown in FIG. 6C. The first molding layer 206 is ground to expose the solder bump 205 from the thinned first molding layer 206', as shown in FIG. 6D. The wafer 200 is cut along the grooves 210 to separate the wafer level chip scale packages 200"E as shown in FIG. 6E. In this embodiment, the metal layer is not formed on the backside of the thinned wafer 200, thus no electrode is formed on the bottom of the chip 200'. Therefore, the chip 200' can be a lateral MOSFET with the redistributed bonding pads 204 forming the signal terminals on the front side of the chip 200'. In the wafer level chip scale package 200"E, the bonding pads 201 formed on the top of the chip 200' are redistributed, by utilizing the RDL technique, as the redistributed bonding pads 204 locating inside the dielectric layer 202'. The wafer level chip scale package 200"E includes the top molding portion 206" covering the dielectric portion 202' and the bottom molding portion 211' including a first extension 211'a covering the bottom of the chip 200' and a second extension 211'b perpendicular to the first extension 211'a covering the sidewalls of the chip 200', dielectric portion 202' and top molding portion 206" with the solder bump 205 exposed out from the top molding portion 206".

Figure 7A:
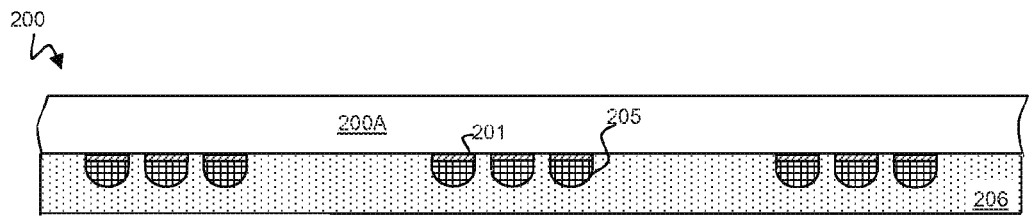
FIG. 7A-7E are cross-sectional schematic views showing a fabrication processes without redistribution of the bonding pads and the formation of the through holes as well as the electrodes on the backside of the chip according to an alternative embodiment of the present invention.
Figure 7B:
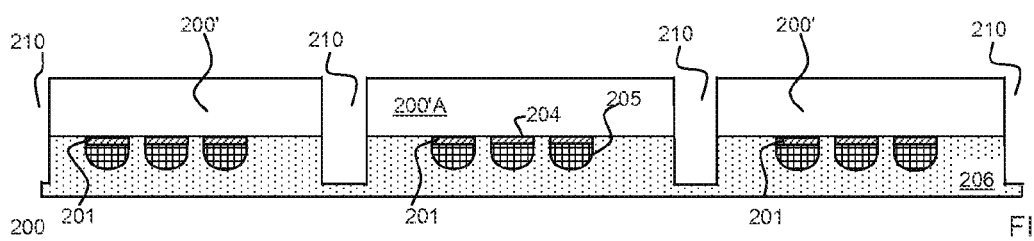
Figure 7C:
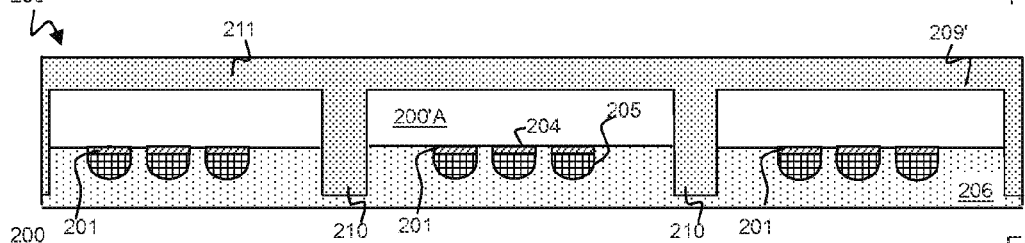
Figure 7D:
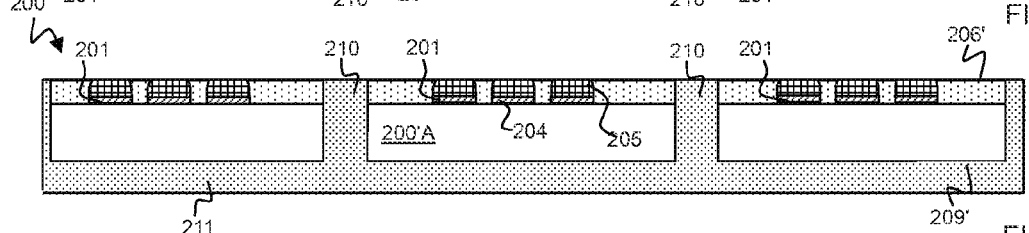
Figure 7E:
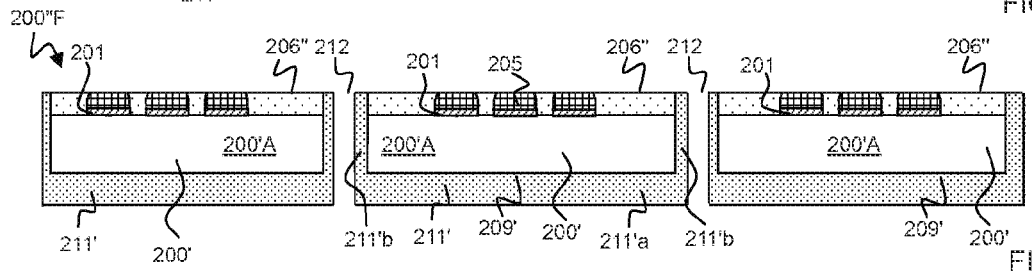

FIG. 7A-7E are cross-sectional views illustrating an alternative process of the process shown in FIGS. 6A-6E, excepting that the solder bump can be directly placed on the bonding pads 101 at the top of the chip 100 shown in FIG. 1E, i.e., the bonding pads 101 are not redistributed by the RDL technique and the step of depositing an dielectric layer 202 is omitted. As shown in FIG. 7A, the solder bump 205 is directly formed on the bonding pads 201 of the wafer 200 (as shown in FIG. 2A) and a first molding layer 206 is then formed to cover the front side of the wafer 200 and the solder bump 205. The backside of the wafer 200 is ground, for example by the CMP process, to reduce the thickness of the substrate 200A. Then the thinned wafer 200 is cut from its backside to form the cutting grooves 210, each of which locates between two adjacent chips 200', with the bottom of the cutting grooves 210 ending inside the first molding layer 206. As a result, the substrate 200A is cut into a plurality of substrate units 200'A, each of which includes each chip 200'. Then, a second molding layer 211 is formed on the backside of the thinned wafer 200, which also filled the cutting grooves 210, as shown in FIG. 7C. The first molding layer 206 is ground to expose the solder bump out from the thinned first molding layer 206', as shown in FIG. 7D. The wafer is cut along the cutting grooves 210 to obtain a plurality of wafer level chip scale package 200"F as shown in FIG. 7E. Similar to wafer level chip scale package 200"E, in the wafer level chip scale package 200"F, the chip 200' can be a lateral MOSFET with the solder bump 205 formed on the top of the chip 200' and electrically connected to the bonding pads 201 of the chip 200'. The wafer level chip scale package 200"F also includes the top molding portion 206" covering the top of the chip 200' and the bottom molding portion 211' including a first extension 211'a covering the bottom of the chip 200' and a second extension 211'b perpendicular to the first extension 211'a covering the side walls of the chip 200' and top molding portion 206" with the solder bump 205 exposed out from the top molding portion 206".

Figure 8A:
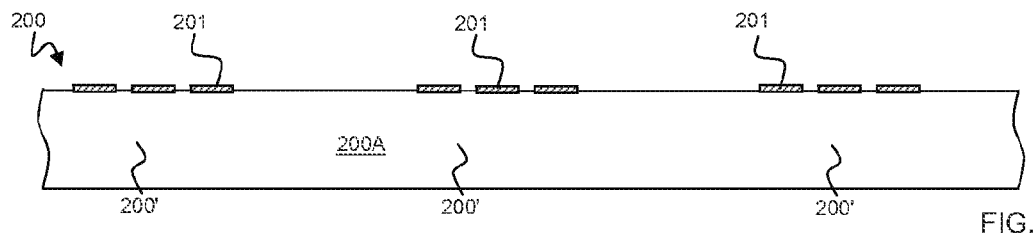
FIGS. 8A-8I are cross-sectional schematic views showing a fabrication processes without the redistribution of the bonding pads, in which the cutting groves are formed on front side and backside of the wafer according to an embodiment of the present invention.
Figure 8B:
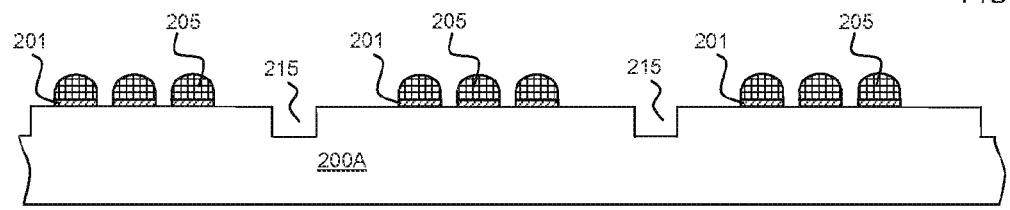
Figure 8C:
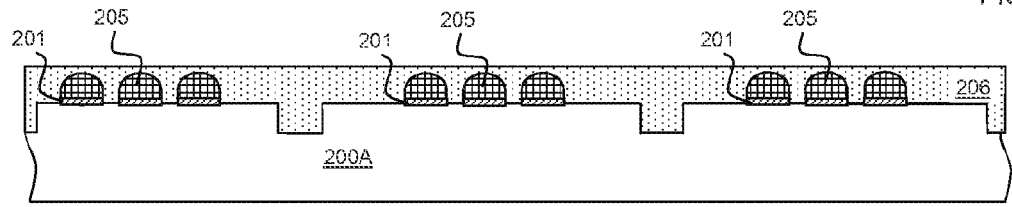
Figure 8D:
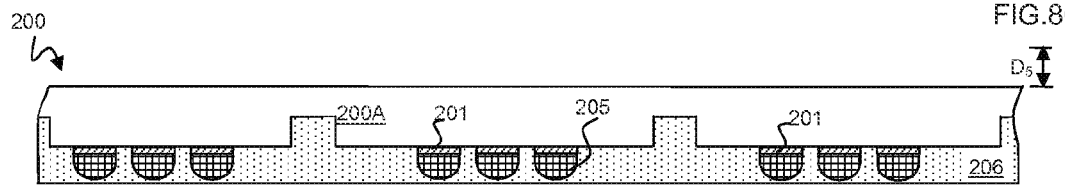
Figure 8E:
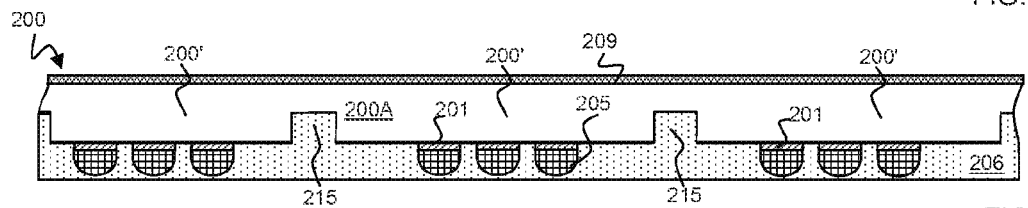
Figure 8F:
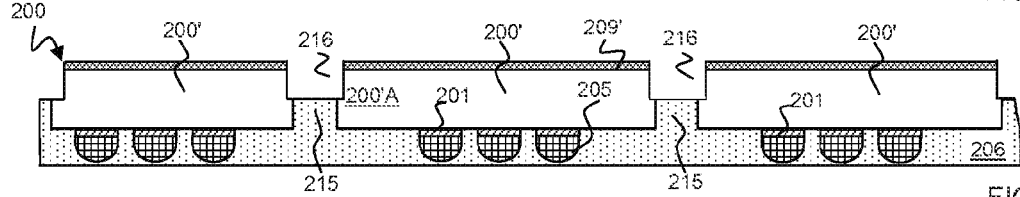
Figure 8G:
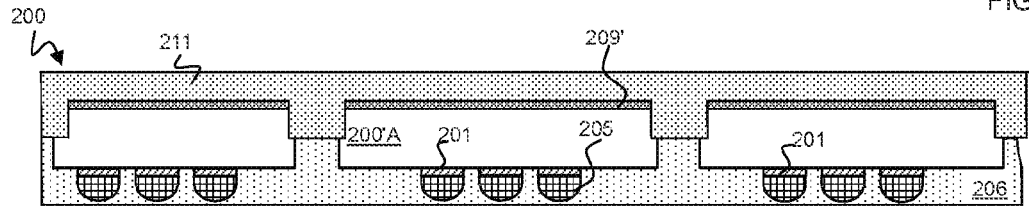
Figure 8H:
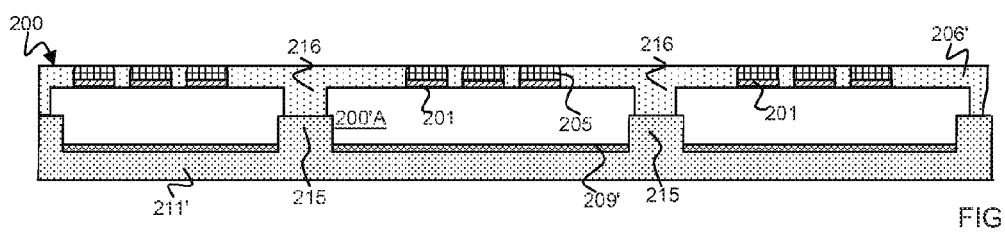
Figure 8I:
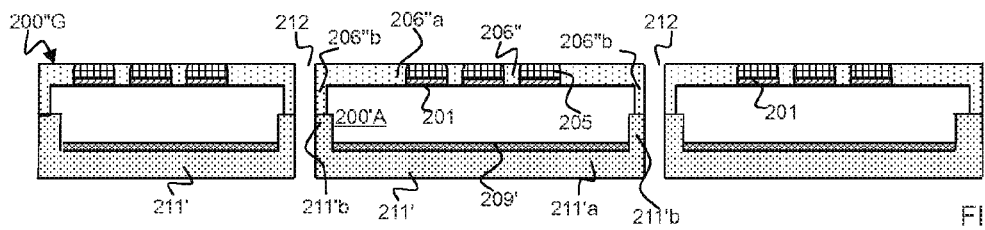

FIGS. 8A-8I are cross-sectional views illustrating a WLP method according to another embodiment of the present invention. As shown in FIGS. 8A-8B, the solder bumps 205 are formed on and electrically connected to the bonding pads 201 at a top surface the chips 200' formed on the front side of the wafer 200 with the solder bumps 205 protruded on the front side of the wafer 200. The wafer 200 is cut from its front side to form front side grooves 215, each of which locates between two adjacent chips 200', with the bottom of the front side grooves 215 extending to a depth shallower than a thickness of the wafer along an edge of the semiconductor chip. The front side grooves 215 can be formed by cutting from the front side of the wafer 200 along the scribe line of the wafer. A first molding layer 206 is deposited to cover the front side of the wafer 200 and the solder bumps 205 and to fill the front side groove 215, as shown in FIG. 8C. The backside of the wafer 200 is ground, for example using a CMP process, to reduce its thickness (i.e. $D_5$), as shown in FIG. 8D. Optionally, the thinned wafer 200 can be etched on its backside to repair the lattice damage caused in grinding process or eliminate the residual stress layer on the backside of the thinned wafer 200. Referring to FIG. 8E, the backside of the thinned wafer 200 is covered with a metal layer 209. Then, the thinned wafer 200 is then cut on its backside to form backside grooves 216, each of which locates between two adjacent chips 200' and is vertically aligned with each front side groove 215 on the front side of the wafer 200 with the bottom of the groove 216 being in contact with the bottom of the groove 215, as shown in FIG. 8F. As a result, the metal layer 209 is cut into the plurality of electrode metal segments 209', each of which covers the bottom of each chip 200'. A second molding layer 211 is deposited to cover the metal layer 209 at the backside of the thinned wafer 200 and to fill in the back side groove 216 with the second molding layer in the back side grooves 216 in contact with the first molding layer in the front side grooves 215, as shown in FIG. 8G. The first molding layer 206 is then ground to expose the solder bump 205 out from the thinned first molding layer 206' as shown in FIG. 8H. Finally, the thinned wafer 200 is cut along the grooves 215 and 216 to separate the plurality of wafer level chip scale packages 200' 200"G, as shown in FIG. 8I.

The wafer level chip scale package 200"G comprises the top molding portion 206" covering the top of the chip 200' with the first extension 206"*a* covering the top of the chip 200' and the second extension 206"*b* perpendicular to the first extension 206"*a* covering a top part of the sidewall of the chip 200' with the solder bump exposed out from the top molding portion 206". The wafer level chip scale package 200"G also comprises the bottom molding portion 211' covering the bottom of the chip 200' with the first extension 211'*a* covering the bottom of the chip 200' and the electrode metal segment 209' and the second extension 211'*b* perpendicular to the first extension 211'*a* covering the bottom part of the sidewall of the chip 200' that is not covered by the extension 206"*b*. The extension 206"*b* of the top molding portion 206' and the extension 211'*b* of the bottom molding portion 211' are brought into contact with each other and thus seal the chip 200' seamlessly. As mentioned above, if the step of depositing the metal layer 209 is omitted in the above fabrication processes, then the chip 200' of the package 200"G may be a lateral MOSFET with all terminals arranged at the front side of the chip 200'. In another alternative embodiment, the chip 200' is a vertical dual common drain MOSFET, in which, the drain electrode of one of the two MOSFETs is electrically connected to the drain electrode of the other by the electrode metal segment 209' and redistributed bonding pads 204 respectively constitute the source electrode and gate electrode of each of the two MOSFETs. In one embodiment, the chip 200' includes a plurality of diodes, in which, one electrode terminal of each diode is electrically connected to the electrode metal segments 209' and redistributed bonding pads 204 respectively constitute other electrode terminals of each diode.

Figure 9A:
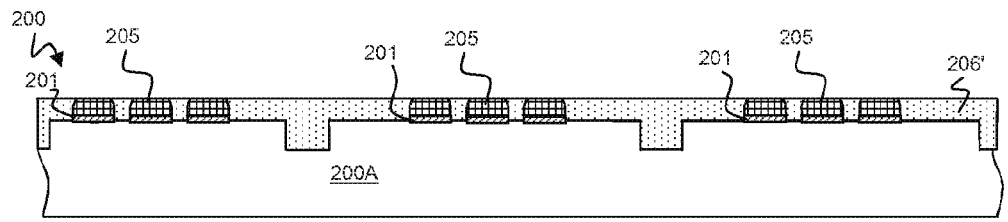
FIGS. 9A-9E are cross-sectional schematic views showing a fabrication processes similar to the process of FIGS. 8A-8I with the first molding layer ground before the metal layer formed at the backside of the wafer according to an alternative embodiment of the present invention.
Figure 9B:
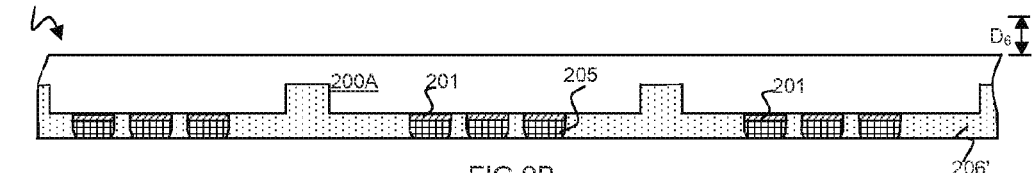
Figure 9C:
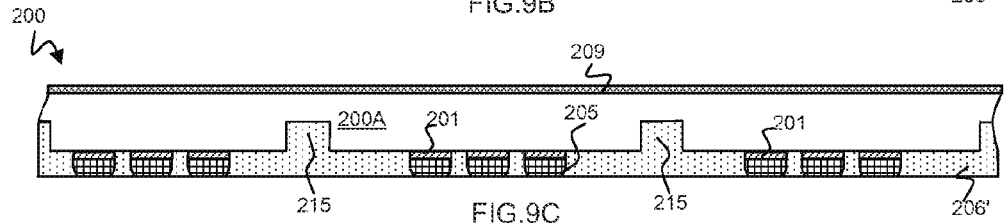
Figure 9D:
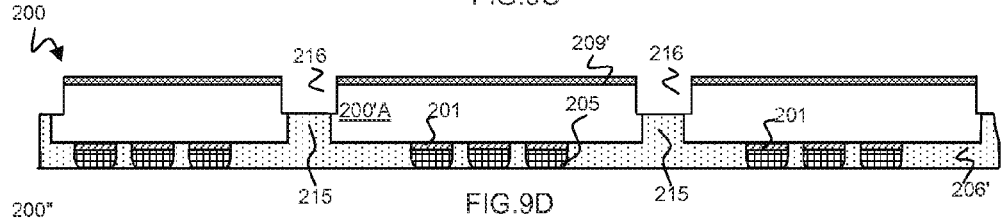
Figure 9E:
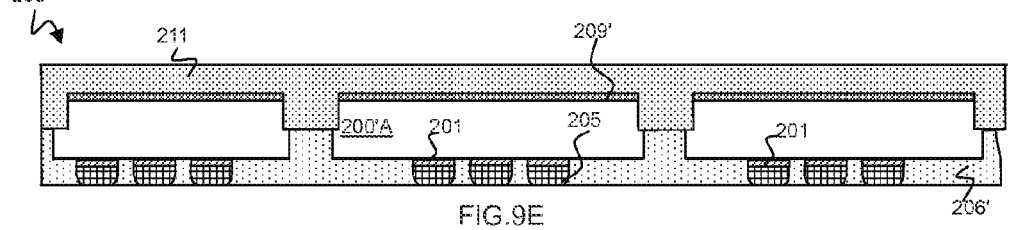

The wafer level chip scale package 200"G may be also manufactured with the method as shown in FIGS. 9A-9E. The step shown in FIG. 9A is equivalent to the step shown in FIG. 8C, in which the front side of the wafer 200 and solder bump 205 are covered with the first molding layer 206, excepting that the first molding layer 206 is ground to expose the solder bump 205 out from the thinned first molding layer 206'. The backside of the wafer 200 is then ground, for example by a CMP process, to reduce the thickness of the wafer 200 (i.e. $D_6$), as shown in FIG. 9B. Optionally, the thinned wafer 200 can be etched on its backside to repair the lattice damage caused in grinding process or eliminate the residual stress layer on the backside of the thinned wafer 200. A metal layer 209 is deposited to cover the backside of the thinned wafer 200, as shown in FIG. 9C. The thinned wafer 200 is then cut on its backside to form back side grooves 216, each of which locates between two adjacent chips 200' with each back side groove 216 vertically aligned and in contact with each of the front side grooves 215 at the other side of the thinned wafer, as shown in FIG. 9D. A second molding layer 211 is applied to cover the electrode metal segments 209' and to fill in the grooves 216, as shown in FIG. 9E. At this step, FIG. 9E is equivalent to FIG. 8H and the final wafer level chip scale packages 200'G are formed as described above in FIG. 8I.

The methods shown in the FIGS. 8A-8I or FIGS. 9A-9E are applicable to the lateral and vertical MOSFET and also to the semiconductor chips undergoing or not undergoing RDL treatment.

Figure 10A:
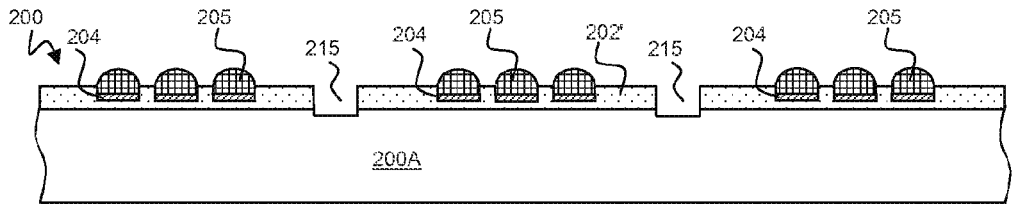
FIGS. 10A-10G are cross-sectional schematic views showing a fabrication processes similar to the process of FIGS. 8A-8I with the redistribution of the bonding pads according to another alternative embodiment of the present invention.
Figure 10B:
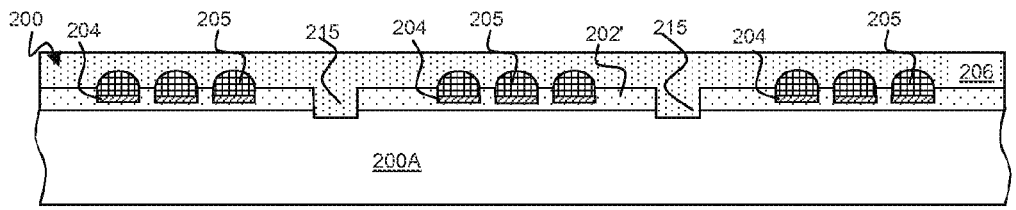
Figure 10C:
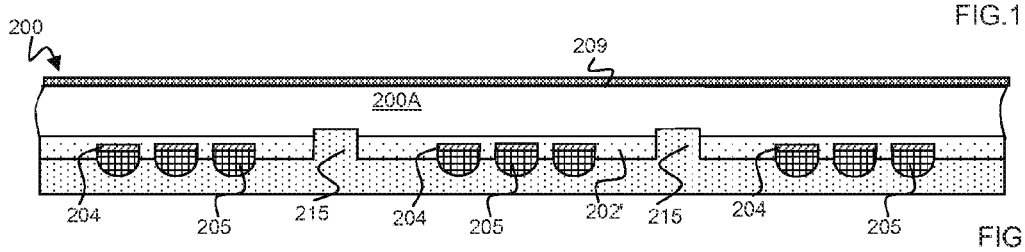
Figure 10D:
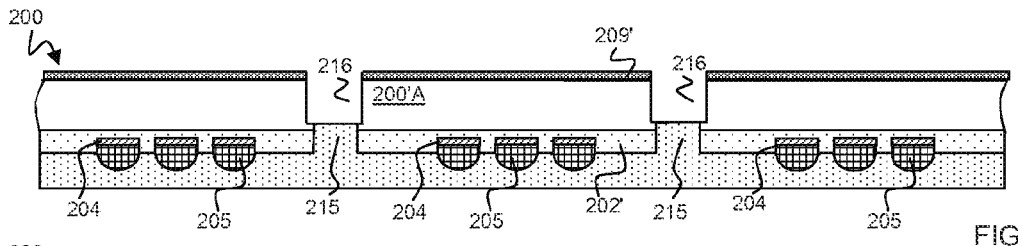
Figure 10E:
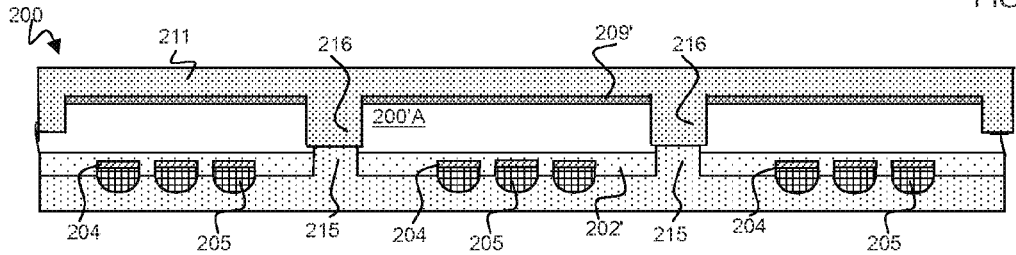
Figure 10F:
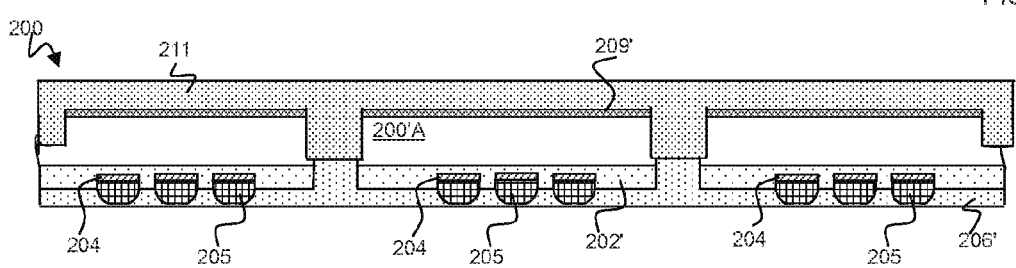
Figure 10G:
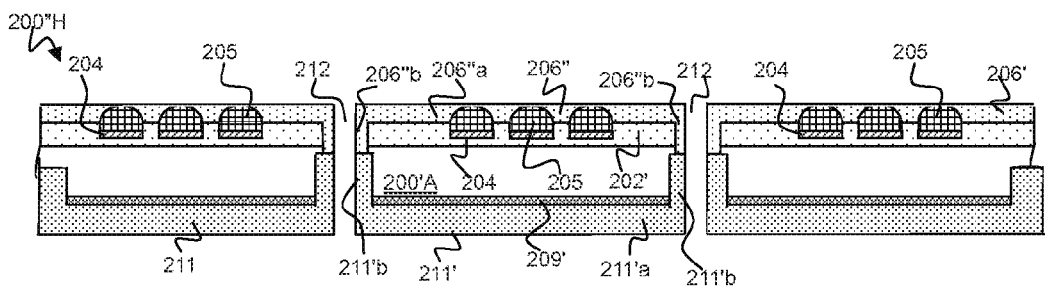

Referring to a WLP method shown in FIGS. 10A-10G and FIGS. 1B-1D, the bonding pads formed on the top of the chip 200' are redistributed as the redistributed bonding pads 204 located in the dielectric layer 202 covering the chip 200' by utilizing the RDL technique, as shown in FIG. 10A. Solder bumps 205 are formed on the redistributed bonding pads 204. The wafer 200 is then cut from its front side to form the front side grooves 215, each of which locates between two adjacent chips 200', extending to a depth shallower than a thickness of the wafer along an edge of the semiconductor chip. A first molding layer 206 is applied to cover the front side of the wafer 200 and the solder bumps, as shown in FIG. 10B and to fill in the front side grooves 215. The wafer 200 is ground at its backside to reduce the thickness of the wafer 200, as shown in FIG. 10C. Optionally, the thinned wafer 200 can be etched on its backside to repair the lattice damage caused in grinding process or eliminate the residual stress layer on the backside of the thinned wafer 200. The thinned wafer 200 is then covered with a metal layer 209 as shown in FIG. 10C. The thinned wafer 200 is cut on its backside to form backside grooves 216, each of which is located between two adjacent chips 200' and is vertically aligned and in contact with each front side groove 215, as shown in FIG. 10D. As such, the metal layer 209 is cut into the plurality of electrode metal segments 209', each of which covers the bottom of each chip 200'. A second molding layer 211 is applied to the backside of the thinned wafer 200 to cover the metal segments 209' and to fill in the backside grooves 216, as shown in FIG. 10E. The first molding layer 206 is ground to expose the solder bumps 205 out from the thinned first molding layer 206' as shown in FIG. 10F. The wafer is then cut along the backside grooves 216 and the front side grooves 215 to separate the wafer level chip scale packages 200"H, as shown in FIG. 10G. As a result, the dielectric layer 202 is also cut into the plurality of top dielectric portions 202', each of which is located on the top of each chip 200', and the thinned first molding layer 206' is cut into the plurality of the top molding portions 206" covering the top dielectric portions 202'.

Figure 10H:
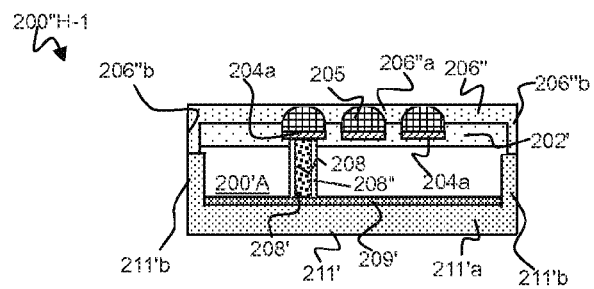
FIGS. 10H-10I are cross-sectional views of the wafer level chip scale package according to the alternative embodiment of the present invention.

Alternatively, in the processes as shown in FIGS. 10A-10G, before the metal layer 209 is deposited on the backside of the thinned wafer 200 as shown in FIG. 10C, the steps of forming through holes 208 that are then filled with a conductive material as shown in FIGS. 2A-2H can be applied. The final wafer level chip scale packages 200"H-1 is then formed as shown in FIG. 10H.

Figure 10I:
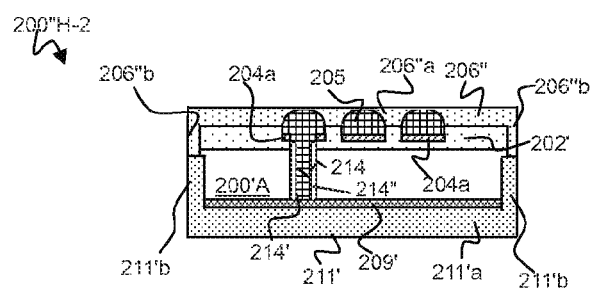

Similarly, in the processes as shown in FIGS. 10A-10G, before the metal layer 209 is deposited on the backside of the thinned wafer 200 as shown in FIG. 10C, the steps of forming through holes 214 that are filled with a solder material and the solder pumps 205 is then formed on the redistributed bonding pads 204 as shown in FIGS. 3A-3F may be applied. The final wafer level chip scale packages 200'H-2 are formed as shown in FIG. 10I.

In each wafer level chip scale package 200"H, the top molding portion 206" covering the top of the chip 200' includes a first extension 206"*a* covering the top dielectric portion 202' and a second extension 206"*b* perpendicular to the first extension 206"*a* covering the side wall of the top dielectric portion 202' and a top part of the sidewall of the chip 200' with the solder bump exposed out from the top molding portion 206". The bottom molding portion 211' covering the bottom of the chip 200' includes a first extension 211'a covering the electrode metal segment 209' at the bottom of the chip 200' and a second extension 211'b perpendicular to the first extension 211'a covering the bottom part of the sidewall of the chip 200'.

Similar to wafer level chip scale packages 200"A and 200"B shown in FIGS. 2M and 3J, the wafer level chip scale packages 100H"-1 and 100H"-2 can be a vertical MOSFET, with the electrode metal segment 209' functioning as the drain electrode of the MOSFET.

In the above methods, the thickness of the first molding layer 206 before it is ground to expose the solder bumps should be larger than the height of the solder bump 205 such that sufficient mechanical support can be provided in the wafer grinding process and subsequent working procedures after the wafer is thinned. Furthermore, the second molding layer 211 formed on the backside of the thinned wafer also provides sufficient mechanical support before the thickness of the first molding layer 206 is reduced so that the wafer can be ground to be thinner without being limited by the thickness of the first molding layer 206 or the height of the solder bump 205. Same or different molding compound can be selected for forming the first and second molding layers 206 and 211.

The typical embodiments of particular structures are provided by the above descriptions and drawings. For example, this present invention is described by taking the MOSFET and dual common drain MOSFET. Based on the spirit of the present invention, the chip can be other types. Although the abovementioned invention provides better embodiments compared to the existing ones, such embodiments do not constitute a restriction.

It will be apparent to those skilled in the art that various modifications and variations can be made to the structure of the present invention without departing from the scope or spirit of the invention. Therefore, the claims shall be deemed as all modifications and variations covering the true spirit or scope of the present invention. It is intended that the present invention cover modifications and variations of this invention provided they fall within the scope of the claims and their equivalents.

The invention claimed is:

1. A wafer level chip scale package method of forming a semiconductor device comprises the following steps:
   providing a wafer comprising a plurality of semiconductor chips;
   forming a plurality of solder bumps on a front side of the wafer electrically connected to a plurality of bonding pads of the semiconductor chips;
   casting a first molding material on the front side of the wafer such that the front side of the wafer and the solder bumps are covered by a first molding layer;
   grinding a backside opposite to the front side of the wafer;
   cutting through the wafer from its backside after grinding to form cutting grooves separating each of the semiconductor chips, and the cutting grooves extending to a depth in the first molding layer;
   casting a second molding material on the backside of the wafer to form a second molding layer covering the backside of the thinned wafer and at the same time filling in the cutting grooves;
   grinding the first molding layer to expose a top surface of the solder bumps;
   cutting along the cutting grooves to separate the semiconductor chips, the first and second molding layers covering the front side, the backside and sidewalls of the separated chips.

2. The method of claim 1, wherein the plurality of bonding pads comprise first type bonding pads electrically connected to an electrode disposed on the backside of the wafer.

3. The method of claim 2 further comprises, after grinding the backside of the wafer, forming a plurality of through holes from the backside of the thinned wafer reaching a plurality of the first type bonding pads and depositing a conductive material into the through holes in electrical contact with the first type bonding pads, the first type bonding pads being located on a dielectric layer covering a substrate portion of a device non-active area.

4. The method of claim 3, further comprising: after forming the through holes, depositing an insulation liner layer on an internal sidewall of the through holes and before depositing the conductive material in the through holes electrically contacting the first type bonding pads.

5. The method of claim 3, wherein the step of depositing the conductive material into the through holes further comprises a step of depositing a metal layer on the backside of the thinned wafer.

6. The method of claim 5, wherein the semiconductor chips are vertical MOSFET chips and the metal layer on the backside of the wafer, which is electrically connected to the first type bonding pads by the conductive material deposited in the through holes, functions as drain electrodes.

7. The method of claim 2, further comprising, before forming the solder bumps on the front side of the wafer, forming a plurality of through holes from the front side of the wafer penetrating through the first type bonding pads into a depth of a substrate portion in a device non-active area and the step of forming solder bumps further comprising a step of filling the through holes with a solder material.

8. The method of claim 7 further comprising, after the through holes' formation, depositing a dielectric liner layer on an internal sidewall of the through holes for insulating the solder material filling in the through holes from the substrate portion surrounding the through holes.

9. The method of claim 8 further comprising a step of depositing a metal layer on the backside of the thinned wafer.

10. The method of claim 9, wherein the chips being vertical MOSFET chips and the metal layer on the backside of the wafer, which is electrically connected to the first type bonding pads by the solder material filling the through holes, functions as a drain electrode of the MOSFET chips.

11. The method of claim 7, wherein the through holes are formed by dry etch, wet etch or laser blaze process.

12. The method of claim 1, further comprising the following steps:
   before casting the first molding layer onto the front side of the wafer, cutting the wafer on the front side to form a plurality of front side grooves extending to a depth shallower than a thickness of the wafer along an edge of each of the semiconductor chips;
   wherein the step of casting the first molding material onto the front side of the wafer further comprises filling the front side grooves with the first molding layer;
   wherein the step of cutting through the wafer from the backside comprises cutting through the wafer along the front side grooves to expose the first molding layer filling the front side grooves.

13. The method of claim 12, further comprises: after grinding the backside of the wafer, etching the backside of the thinned wafer followed by depositing a metal layer covering the backside of the thinned wafer, wherein the step of cutting through the wafer from its backside forming the cutting grooves separating the semiconductor chips further comprising cutting through the metal layer located on the backside of the thinned wafer wherein the second molding layer covering the backside of the thinned wafer further encapsulating the metal layer.

14. The method of claim 12, further comprising, before depositing a metal layer on the backside of the thinned wafer, depositing a photoresist mask on the backside of the wafer and etching through the wafer thus forming a plurality of through holes reaching a plurality of first type bonding pads of the plurality of bonding pads, wherein the step of depositing the metal layer on the backside of the wafer further comprises depositing a conductive material inside the through holes thus electrically connecting the metal layer to the first type bonding pads.

15. The method of claim 14, wherein the first type bonding pads being located on a dielectric layer covering a substrate portion of a device non-active area.

16. The method of claim 13, further comprising, before forming the solder bumps on the bonding pads of the plurality of bonding pads, depositing a photoresist mask on the front side of the wafer and etching through a plurality of first type bonding pads and the wafer thus forming a plurality of through holes, wherein the step of forming a plurality of solder bumps further comprising filling solder material inside the through holes thus electrically connecting the metal layer to the first type bonding pads.

17. The method of claim 16, wherein the step of grinding the backside of the wafer further comprises grinding the wafer to expose a solder material filling the through holes from the backside of the thinned wafer, thus electrically connecting the metal layer subsequently deposited on the backside of the thinned wafer to the first type bonding pads.

18. The method of claim 1 further comprises, after the step of grinding the backside of the wafer, covering the backside of the thinned wafer with a metal layer, wherein the second molding layer covering the backside of the thinned wafer further encapsulating the metal layer.

19. The method of claim 18, wherein the semiconductor chips are a dual vertical MOSFET chips having a common drain electrode, wherein a drain electrode of one MOSFET being electrically connected with a drain electrode of another MOSFET and at least part of the bonding pads connected to a source electrode and a gate electrode of each MOSFET.

20. The method of claim 1 further comprising a step of redistributing the bonding pads as an array of redistributed bonding pads on top of a dielectric layer covering the top surface of the chips, wherein the solder bumps being placed on the array of redistributed bonding pads forming a solder bump array.

21. A wafer level chip scale package structure having a plurality of solder bumps electrically connected to a plurality of bonding pads formed on a top surface of a semiconductor chip comprises:
a first molding layer covering the top surface of the semiconductor chip, surrounding a sidewall surface of the solder bumps and having a top surface being coplanar with an exposed surface of the solder bumps;
a second molding layer covering a bottom of the semiconductor chip, the second molding layer wrapping around a bottom edge of the chip covering a sidewall of the chip and extending to the first molding layer to seal the semiconductor chip seamlessly.

22. The wafer level chip scale package structure of claim 21 further comprising a metal layer contacting and covering the bottom of the semiconductor chip and the second molding layer covering the bottom of the semiconductor chip further encapsulating the metal layer.

23. The wafer level chip scale package structure of claim 22 further comprising a through hole penetrating through the semiconductor chip with a conductive material deposited therein electrically connecting the metal layer covering the bottom of the semiconductor chip to a first type bonding pad of the plurality of bonding pads formed inside of a dielectric layer disposed on the top surface of the semiconductor chip in a non-active device area.

24. The wafer level chip scale package structure of claim 23, further comprising a dielectric liner layer on an internal sidewall of the through hole, the dielectric liner layer insulating the conductive material deposited therein from a substrate area surrounding the through hole.

25. The wafer level chip scale package structure of claim 24, wherein the through hole further penetrates through the first type bonding pad, wherein a solder bump placed on the first type bonding pad extending into the through hole is electrically connecting to the metal layer.

26. The wafer level chip scale package structure of claim 23, wherein the chip is a MOSFET chip and the first type bonding pad is in contact with the through hole constituting a drain electrode of the MOSFET chip.

27. The wafer level chip scale package structure of claim 21, wherein the first molding layer wrapping around a top edge of the semiconductor chip covering a top portion of the sidewall of the chip, the first molding layer and the second molding layer interfacing at the sidewall of the semiconductor chip seamlessly encapsulating the semiconductor chip.

28. The wafer level chip scale package structure of claim 21, wherein the first and second molding layers are of different molding compounds.

29. The wafer level chip scale package structure of claim 22, wherein the semiconductor chip is a dual vertical MOSFETs chip having a common drain electrode, wherein, a drain electrode of one MOSFET being electrically connected with a drain electrode of another MOSFET by the metal layer.

* * * * *